United States Patent
Wang et al.

[11] Patent Number: 5,844,825
[45] Date of Patent: Dec. 1, 1998

[54] BIDIRECTIONAL SHIFTER CIRCUIT

[76] Inventors: Song-Tine Wang, 32, Alley 18, Lane 210, Tung-Nan St., Hsinchu; Shih-Yin Lin, 16, 4th Fl., Ln 216, Kuan-Ming Road, Chutung, Hsinchu; Shing-Wu Tung, 11, 2nd Fl., Ln 308, Hoping East Rd, Sec. 3, Taipei, all of Taiwan

[21] Appl. No.: 707,222

[22] Filed: Sep. 3, 1996

[51] Int. Cl.$^6$ .................................................. G06F 5/01
[52] U.S. Cl. ......................................... 364/715.08
[58] Field of Search ........................................ 364/715.08

[56] References Cited

U.S. PATENT DOCUMENTS

| | | | |
|---|---|---|---|
| 4,122,534 | 10/1978 | Cesaratto | 364/715.08 |
| 4,472,788 | 9/1984 | Yamazaki | 364/900 |
| 4,475,173 | 10/1984 | Talmi | 364/715.08 |
| 4,488,252 | 12/1984 | Vassar | 364/715.08 |
| 4,509,144 | 4/1985 | Palmer et al. | 364/900 |
| 4,583,197 | 4/1986 | Chappell et al. | 364/900 |
| 4,665,538 | 5/1987 | Machida | 377/69 |
| 4,782,457 | 11/1988 | Cline | 364/715.04 |
| 4,829,460 | 5/1989 | Ito | 364/715.08 |
| 4,839,839 | 6/1989 | Tokumaru et al. | 364/715.08 |
| 5,020,013 | 5/1991 | Maher, III et al. | 364/715.08 |
| 5,130,940 | 7/1992 | Dmote | 364/715.08 |
| 5,262,971 | 11/1993 | Yamaguchi | 364/715.08 |

Primary Examiner—David H. Malzahn
Attorney, Agent, or Firm—Proskauer Rose LLP

[57] ABSTRACT

A bidirectional shifter circuit is disclosed for shifting an inputted data word a chosen number of bit positions in either a first or a second chosen direction. The bidirectional shifter circuit is provided with a first bit-reversing circuit which receives an inputted data word. In response to choosing a first shift direction, the first bit-reversing circuit outputs the data word with the bits in their original order. In response to choosing the second shift direction, the first bit-reversing circuit outputs the data word with the bits in reverse order. A single-direction shifter circuit is provided which receives the data word outputted by the first bit-reversing circuit and shifts the received data word the chosen number of bit positions in the first direction. A second bit-reversing circuit is provided which receives the shifted data word and which, in response to choosing the first shift direction, outputs the data word with the bits in the same order as received and, in response to choosing the second shift direction, outputs the data word with the bits in reverse order.

8 Claims, 14 Drawing Sheets

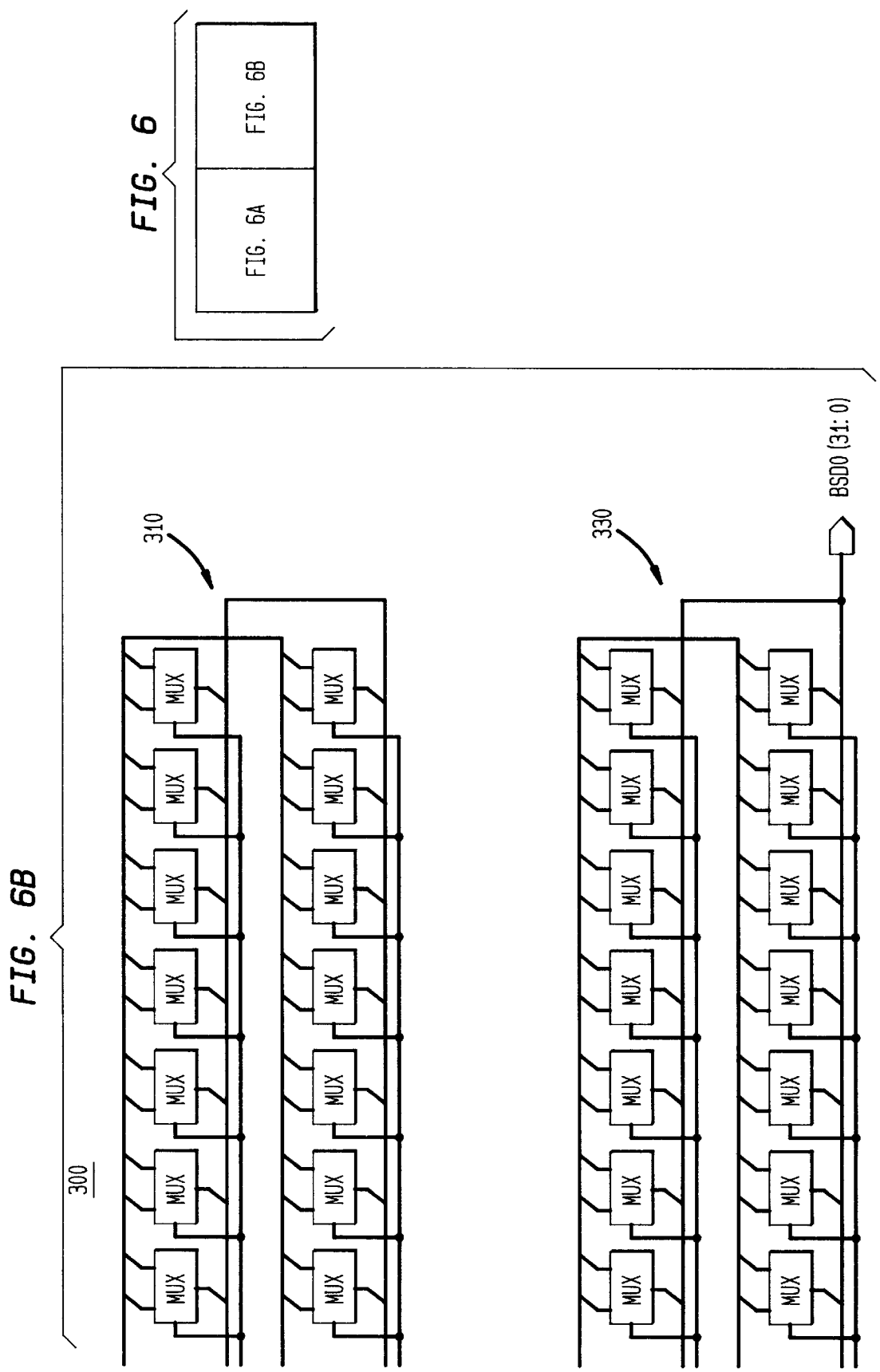

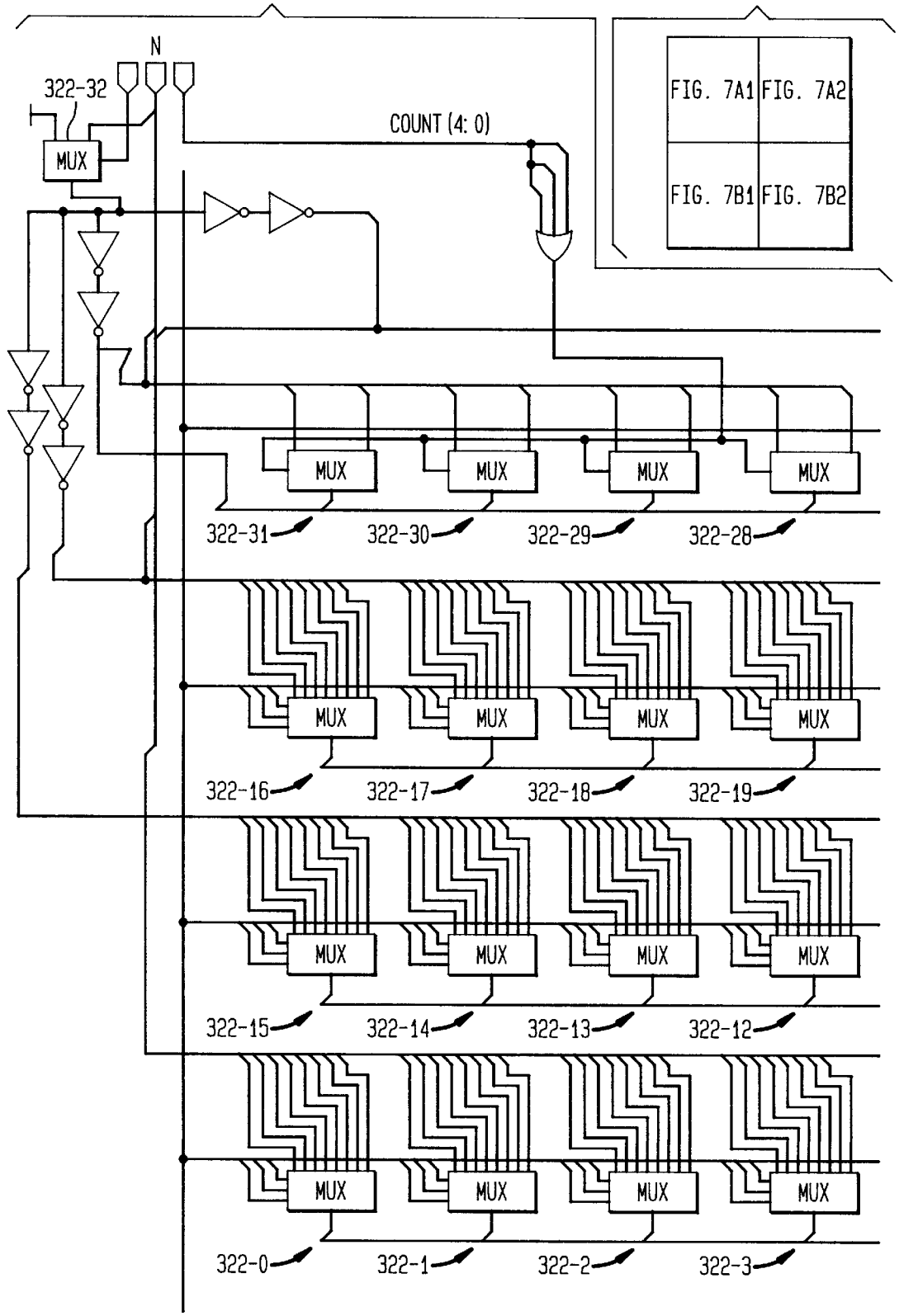

FIG. 7A2
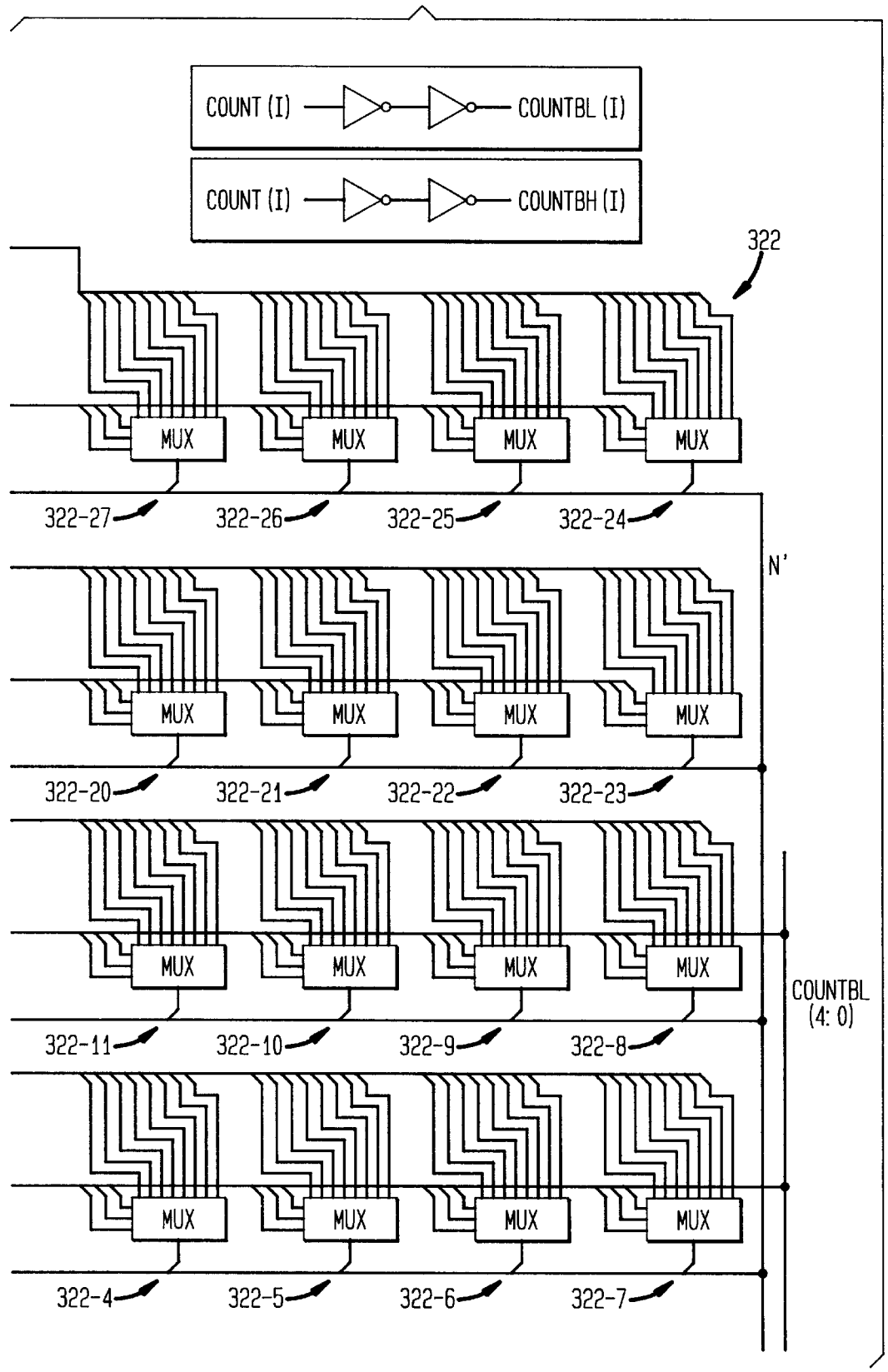

FIG. 7B1
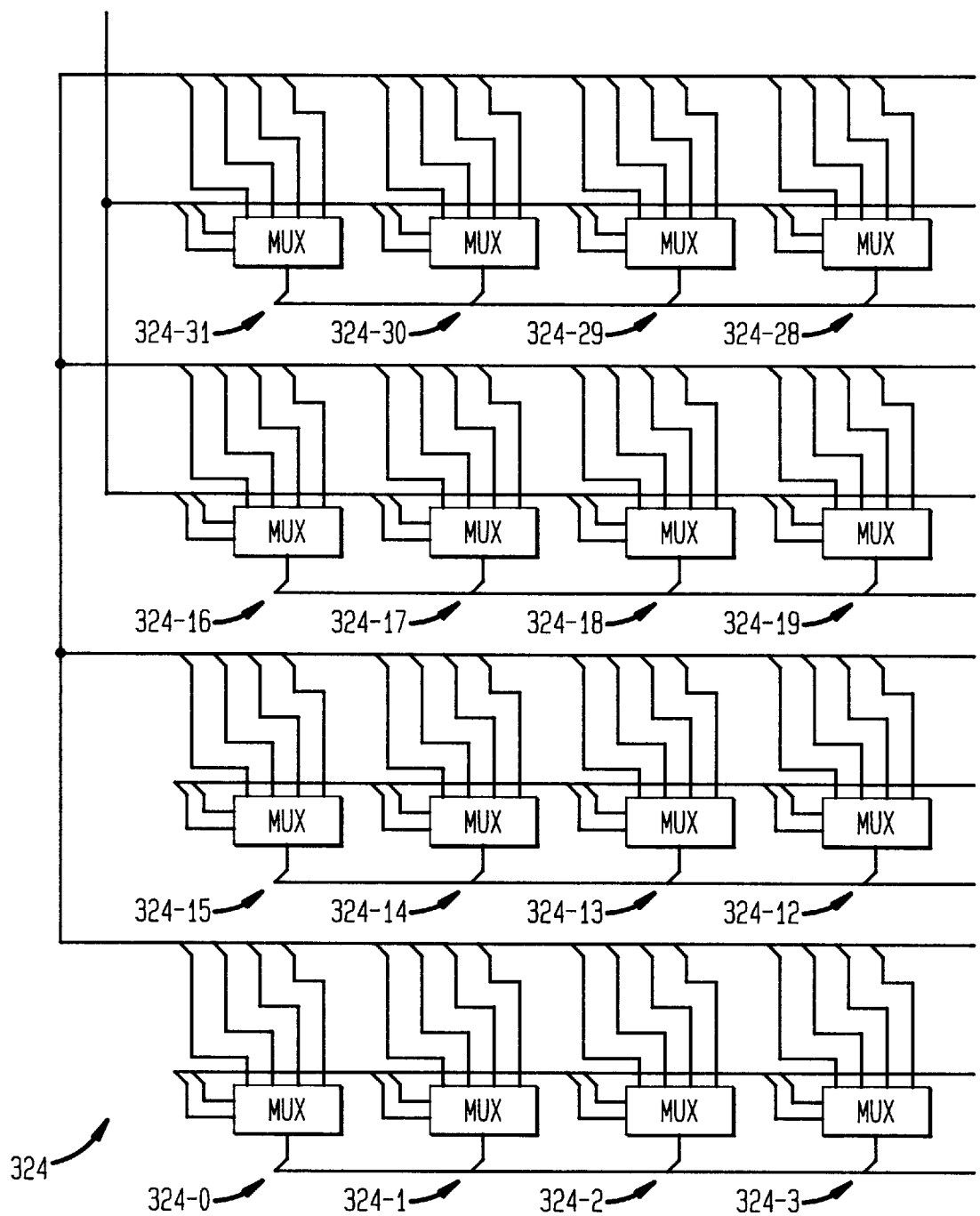

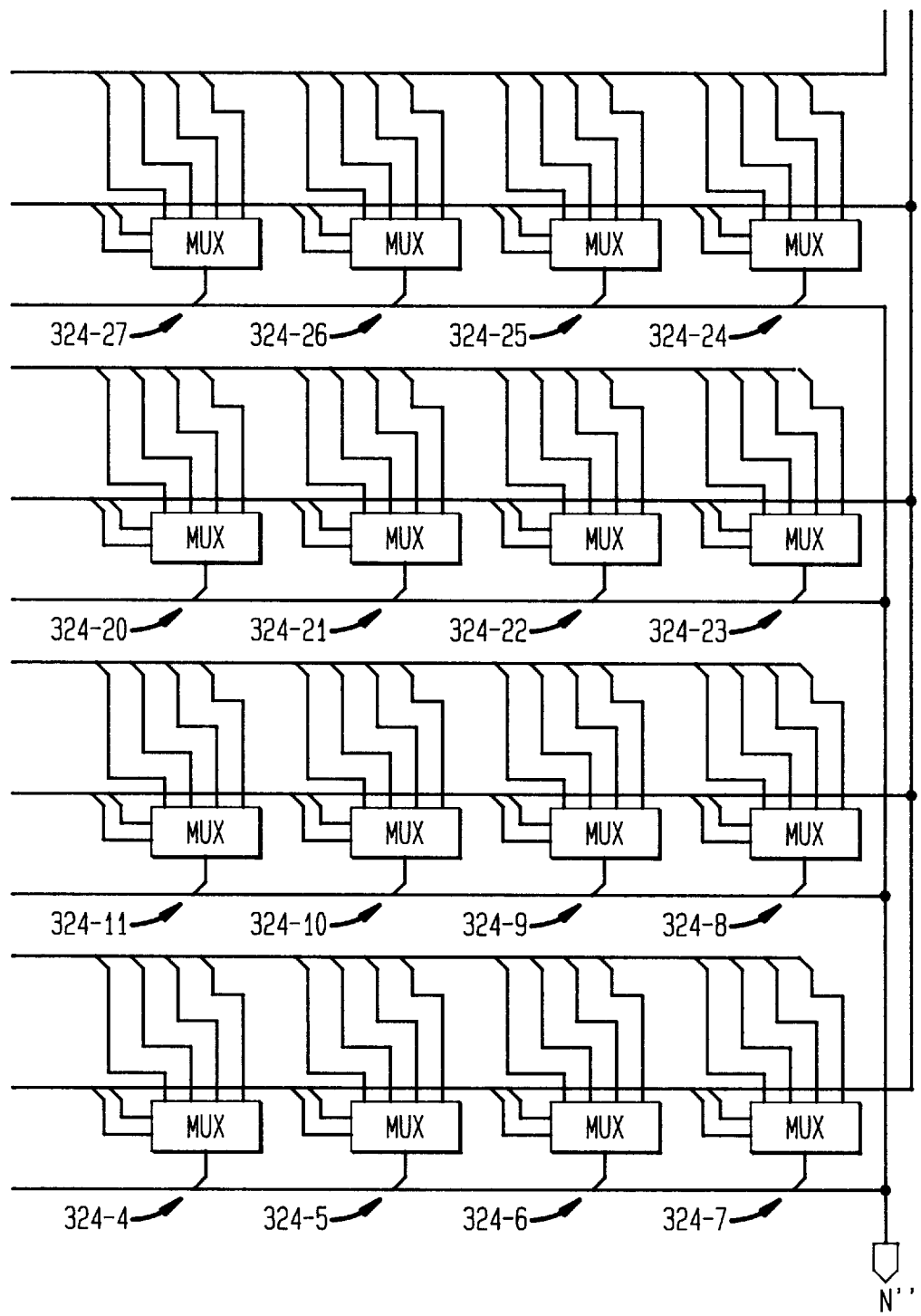
FIG. 7B2

BIDIRECTIONAL SHIFTER CIRCUIT

FIELD OF THE INVENTION

The present invention relates to a shifter circuit capable of shifting a data word a desired number of bit positions in a desired direction, i.e., left or right.

BACKGROUND OF THE INVENTION

A shifter circuit is a logic circuit which shifts the bits of an inputted data word in a particular direction, i.e., left or right. Shifter circuits may be independent circuits or may be part of a central processing unit (CPU) or digital signal processor (DSP).

Shifter circuits can be classified as either:

(1) barrel or cyclic shifters, or (2) simple or linear shifters.

A single-direction shifter circuit is designed to shift the bits of the data word in only one, predetermined direction, i.e., the direction is not choosable. For example, assume the single-direction linear shifter circuit is a right linear shifter circuit, the inputted data word has five bits: 'A B C D F' and it is desired to shift the data word three bit positions. The shifting is as follows:

| | |
|---|---|
| A B C D E | input data word |
| X Y Z A B | output data word |

Here the bits X, Y, and Z can for instance be all the same logic value, i.e., logic '1' or logic '0'. In an arithmetic shift, bits X, Y and Z are the same logic value as the bit A so as to maintain the original sign of the inputted data word (formerly maintained in the bit 'A').

A single-direction barrel shifter shifts the bits of the data word in a slightly different manner. As the bits are shifted in a particular direction, any bits shifted out of one end of the data word are shifted back in at the opposite end of the data word. Thus, in a left barrel shifter circuit, the data word 'A B C D E' would be shifted three bit positions as follows:

| | |
|---|---|
| A B C D E | input data word |
| D E A B C | output data word |

FIG. 1 shows a first conventional bidirectional shifter 1 for shifting an n-bit data word (where n is an integer≧1) m bit positions (0≦m≦n) in a desired direction, i.e., either to the right or the left. An n-bit data word to be shifted is inputted via a data line 2 to a right shifter circuit 3 (via an n-bit data bus 2b) and to a left shifter circuit 4 (via an n-bit data bus 2a). The left and right shifter circuits can be either linear or barrel shifter circuits depending on whether the bidirectional shifter 1 is a linear or barrel shifter.

Each shifter circuit 3 and 4 receives via the control input line 5a or 5b the shift count which is the desired number of bit positions m to shift the inputted data word. The data word in the right shifter 3 is right shifted m bits and the data word in the left shifter is left shifted m bits. The right shifted data word is inputted to the R input of a multiplexer 6 via the line 7 and the left shifted data word is inputted to the L input of the multiplexer 6 via the line 8. The multiplexer 6 also receives a direction signal via the line 9. Depending on the direction (i.e., left or right) chosen by direction signal, the multiplexer 6 selects either the right shifted data word or the left shifted data word for output from the bidirectional shifter 1.

FIG. 2 shows a second conventional bidirectional shifter 10 which has only one single-direction cyclic shifter 11. The single-direction cyclic shifter 11, e.g., a right cyclic shifter, receives the inputted n-bit data word. The desired shift count m and the desired direction of the shifting are inputted to a two's complement circuit 12. If the chosen shifting direction is the same direction as the single-direction cyclic shifter 11, the inputted shift count m is directly inputted to the single-direction cyclic shifter 11.

On the other hand, if the chosen shifting direction is opposite to that of the single-direction cyclic shifter 11, the circuit 12 computes the two's complement of the inputted shift count and inputs this value to the single-direction cyclic shifter 11. The two's complement of the shift count m is used because cyclically shifting an n-bit number m bits in the direction opposite of the single-direction shifter 11 is equivalent to cyclically shifting the n-bit number the two's complement of m bits in the same direction as the shifter 11. For example, if n=eight and m=two ('010' binary) then shifting the inputted data word 'A B C D E F G H' 2 bits to the right (resulting in 'G H A B C D E F') is the same as shifting the inputted data word m=two's complement of two or six ('110' binary) bits to the left (resulting in 'G H A B C D E F'). Note that this property holds for cyclic shifting but not for linear shifting.

The single-direction cyclic shifter 11 cyclically shifts the inputted data word an appropriate number of bit positions and outputs this cyclically shifted data word. If it is desired to provide a bidirectional linear shifter then an output mask circuit 13 must be connected to the shifter 12 for masking out the undesired bits of the cyclically shifted data word. For example, after shifting right three bits, the three most significant bits of the data word outputted from the single-direction cyclic shifter 11 must be masked out.

Each of the conventional bidirectional shifters is disadvantageous. The first bidirectional shifter 1 (FIG. 1) requires two shifters 3 and 4 (FIG. 1). Furthermore, an n-bit input and output bus 2a, 2b or 7, 8 must be provided for each register 3 or 4 which buses require a great deal of IC chip area. The second bidirectional shifter 10 (FIG. 2) requires a two's complement circuit 12 (FIG. 2) having an adder. The adder circuit slows down the shifter 10 (FIG. 2) making it unsuitable for use in some high speed CPU's or DSP's. Furthermore, a mask circuit 13 (FIG. 2) must be provided if bidirectional linear shifting is desired.

It is therefore an object of the present invention to provide a bidirectional shifter which overcomes the disadvantages of the prior art.

SUMMARY OF THE INVENTION

This and other objects are achieved by the present invention which provides a bidirectional shifter circuit for shifting an inputted data word a chosen number of bit positions in either a first or a second chosen direction. The bidirectional shifter circuit is provided with a first bit-reversing circuit which receives an inputted data word. If a first shift direction is chosen, the first bit-reversing circuit outputs the data word with the bits in their original order. However, if the second shift direction is chosen, the first bit-reversing circuit outputs the data word with the bits in reverse order, e.g., if the data word had the bits 'A B C D E' then the data word 'E D C B A' would be outputted. The data word outputted by the first bit-reversing circuit is inputted to a single-direction shifter circuit which shifts the received data word the chosen number of bit positions in the first direction. This shifted data word is then inputted to a second bit-reversing circuit. Similar to the first bit-reversing circuit, the second bit-reversing circuit outputs the data word with the bits in the same order as received if the first direction is chosen and in reverse order if the second direction is chosen.

The bidirectional shifter according to the present invention provides several advantages. The invention does not require an adder circuit. Nor is it necessary to provide a mask circuit to obtain bidirectionally linear shifting. Furthermore, the embodiment using two bit-reversing circuits and one single-direction shifter conserves space on an IC chip.

BRIEF DESCRIPTION OF THE DRAWINGS

FIGS. 7(a)–7(b) depict a circuit diagram of an arithmetic single direction shifter circuit.

DETAILED DESCRIPTION OF THE INVENTION

Figure 3:
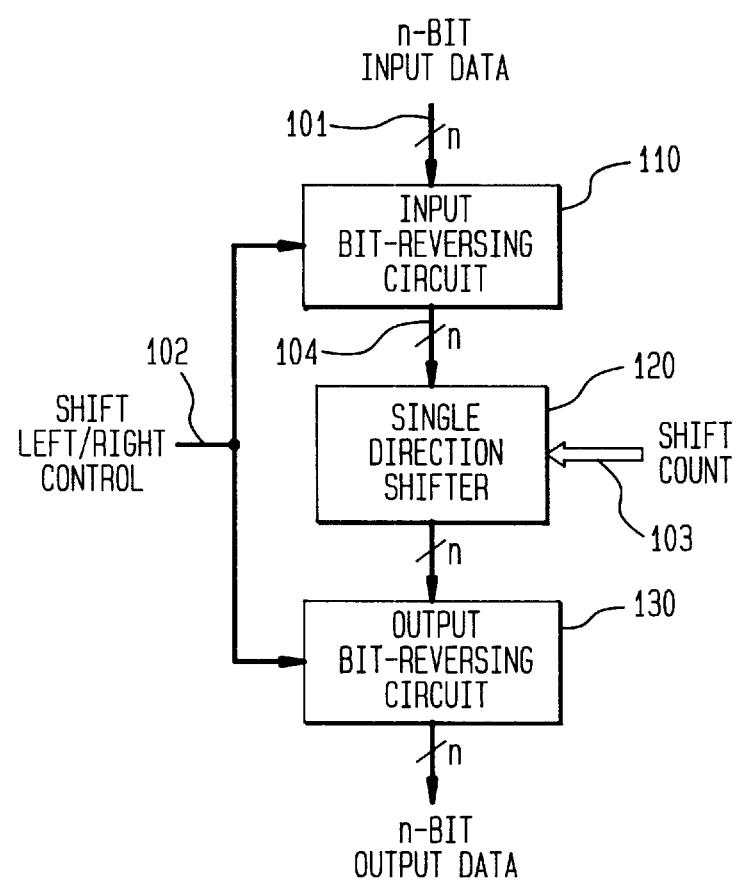
FIG. 3 depicts a bidirectional shifter according to a first embodiment of the present invention.

FIG. 3 depicts a bidirectional shifter circuit 100 according to one embodiment of the present invention. The bidirectional shifter circuit 100 is capable of shifting an n-bit inputted data word a desired number of bits in a chosen direction, i.e., either left or right.

The bidirectional shifter circuit has an input bit-reversing circuit 110 which receives the inputted data word via line 101 and a shift direction control signal via line 102. The input bit-reversing circuit is connected to a single-direction shifter circuit 120 via the lines 104 which shifter circuit 120 also receives a shift count (desired number of bit positions to shift the data word) via line 103. The single-direction shifter circuit 120 is connected to an output bit-reversing circuit 130. The output bit-reversing circuit 130 also receives the chosen shift direction control signal via line 102.

In the circuit 100, the single-direction shifter circuit 120 may be a linear or a cyclic shifter. Furthermore, the single-direction shifter circuit 120 may be a left or right shifter. The shifter circuit 120 may be formed by MOS transistors or multiplexers.

Figure 4:
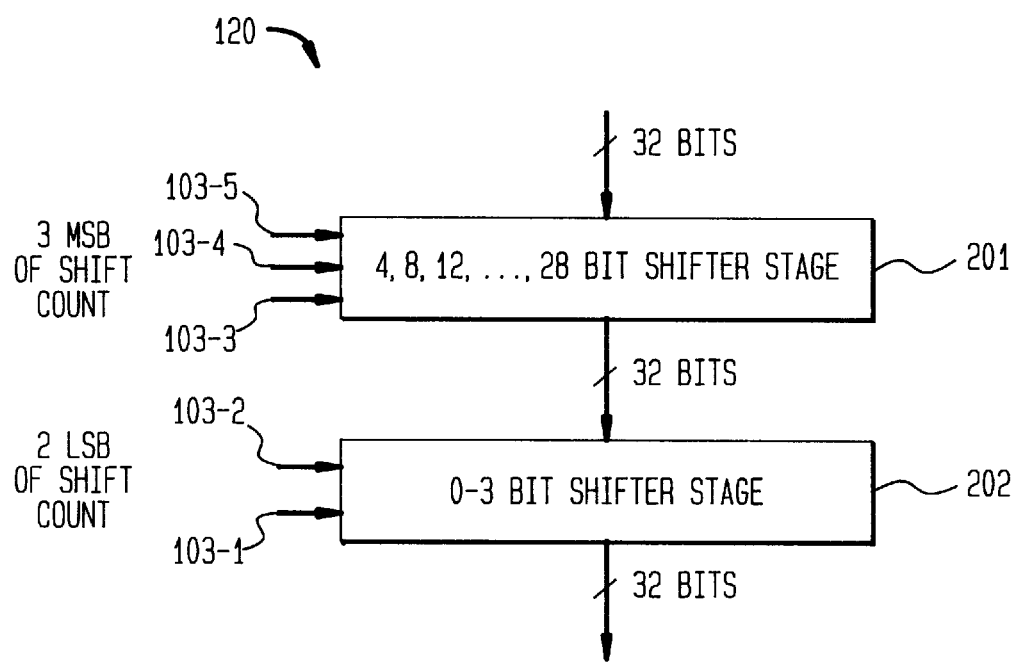
FIG. 4 depicts an exemplary single-direction shifter circuit for use in the bidirectional shifter circuit of FIG. 3.

An exemplary single-direction 32-bit data word shifter circuit 120 using multiplexers is shown in FIG. 4. The single-direction shifter circuit 120 illustratively has two multiplexer stages 201, 202. The first stage 201 is for shifting the data word in large increments q of bit positions (e.g., q=4 bits). The first stage receives the 32-bit data word and the three most significant bits of the shift count via lines 103–5, 103–4, and 103–3. Depending on the shift count value on these lines 103–5, 103–4, and 103–3 (i.e., 0, 4, 8, 12, 16, 20, 24, or 28), the first stage 201 shifts the data word a corresponding amount. For example, suppose the shift count is 19. The three most significant bit lines 103–5, 103–4, and 103–3 of the shift count will have a value 16 thereon. Thus, the first stage 201 shifts the data word 16 bit positions.

The shifted data word is outputted from the first stage 201 to the second stage 202 which further shifts the data word zero to q–1 (e.g., 0, 1, 2, or 3) bit positions. The second stage also receives the two least significant bits of the shift count via the lines 103–2 and 103–. In response to the shift count value on the lines 103–2 and 103–1 (i.e., 0, 1, 2, or 3) the second stage 202 shifts the data word an additional corresponding number of bits. For example, if the shift count is 19, the second stage 202 receives a data word shifted 16 bit positions from the first stage 201 and the value 3 on the two least significant bit lines 103–2 and 103–1. The second stage 202 thus shifts the data word an additional three bit positions.

Referring again to FIG. 3, in operation, an n-bit data word to be shifted is inputted via the line 101, a desired shift direction is inputted via line 102 and the number of bit positions to shift the data word or shift count m (where m is an integer m≧0) is inputted via the line 103. The data word and the chosen shift direction are received at the input bit-reversing circuit 110. If the chosen shift direction is the same direction as the single-direction shifter circuit, the data word is outputted from the input bit-reversing circuit 110 with the bits in their original order. For example, suppose the single-direction shifter circuit 120 is a right cyclic shifter circuit and the chosen direction of shifting is to the right. If the inputted data word was 'A B C D E F G H' then the outputted data word would also be 'A B C D F G H'.

On the other hand, if the chosen shift direction is opposite to the shift direction of the single-direction shifter circuit, the input bit-reversing circuit 110 outputs the data word with the bits in reverse order. For instance, if in the above example, the chosen shift direction was to the left (and therefore opposite to the shift direction of the right cyclic shifter circuit 120), the input bit-reversing circuit 110 would output the data word 'H G F E D C B A'.

Illustratively, both the input and output bit-reversing circuits 110 and 130 are implemented with multiplexers. The input bit-reversing circuit 110 is shown in greater detail in FIG. 5 for an n=8 bit bidirectional shifter circuit 100. As shown, the input bit-reversing circuit 110 is formed by n subcircuits 111-1, 111-2, 111-3, 111-4, 111-5, 111-6, 111-7, and 111-8. Each $p^{th}$ subcircuit 111-p (where p is an integer 1≦p≦n) is illustratively a 1×2 multiplexer. The $p^{th}$ subcircuit 111-p receives the $p^{th}$ bit and the $(n–p+1)^{th}$ bit of the inputted data word as inputs. For example, if the data word 'A B C D E F G H' is inputted on the input data bus 101, the 3rd subcircuit 111-3 receives the $3^{rd}$ bit 'C' and the $6^{th}$ (8–3+1) bit 'F'of the data word inputted on the input data bus 101.

Figure 1:
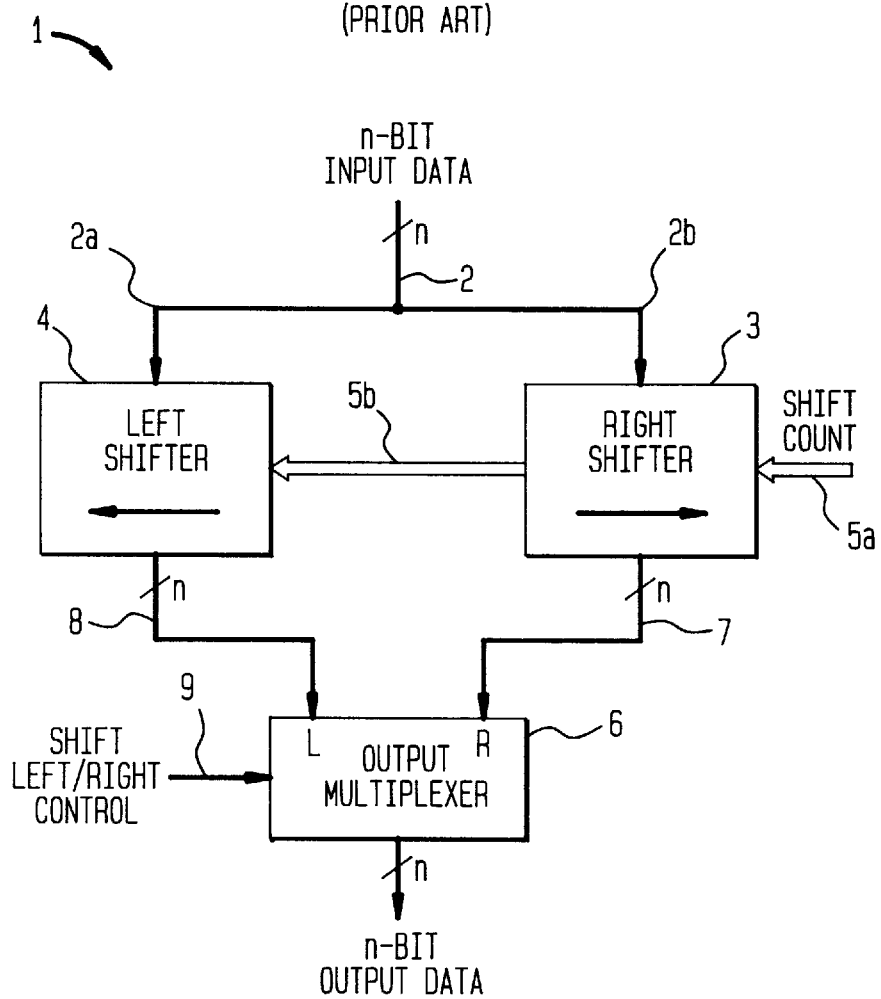
FIG. 1 depicts a first conventional bidirectional shifter.
Figure 2:
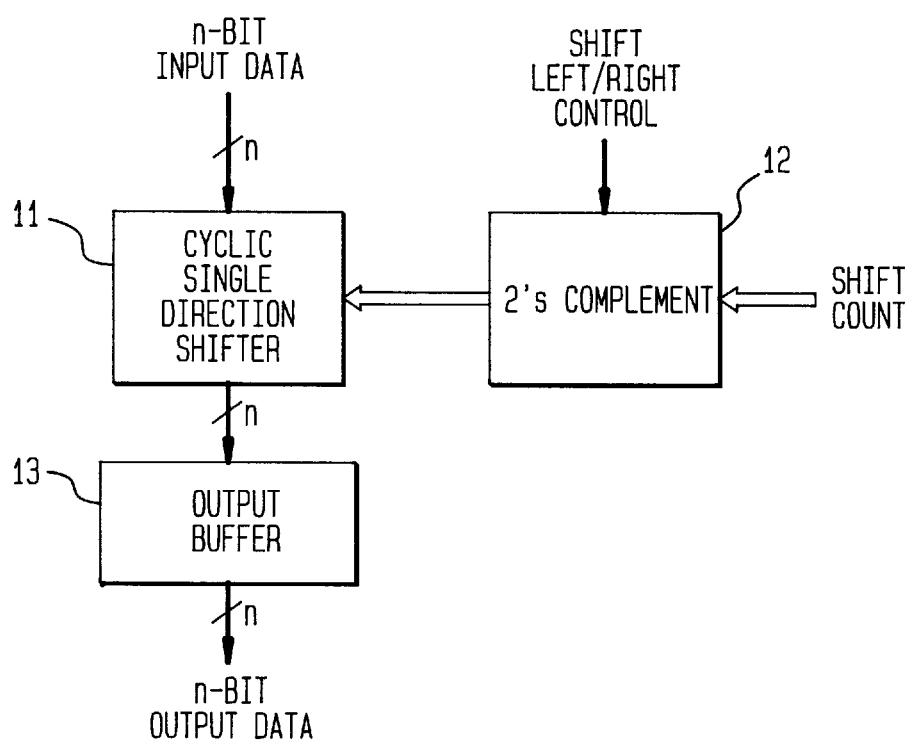
FIG. 2 depicts a second conventional bidirectional shifter.
Figure 5:
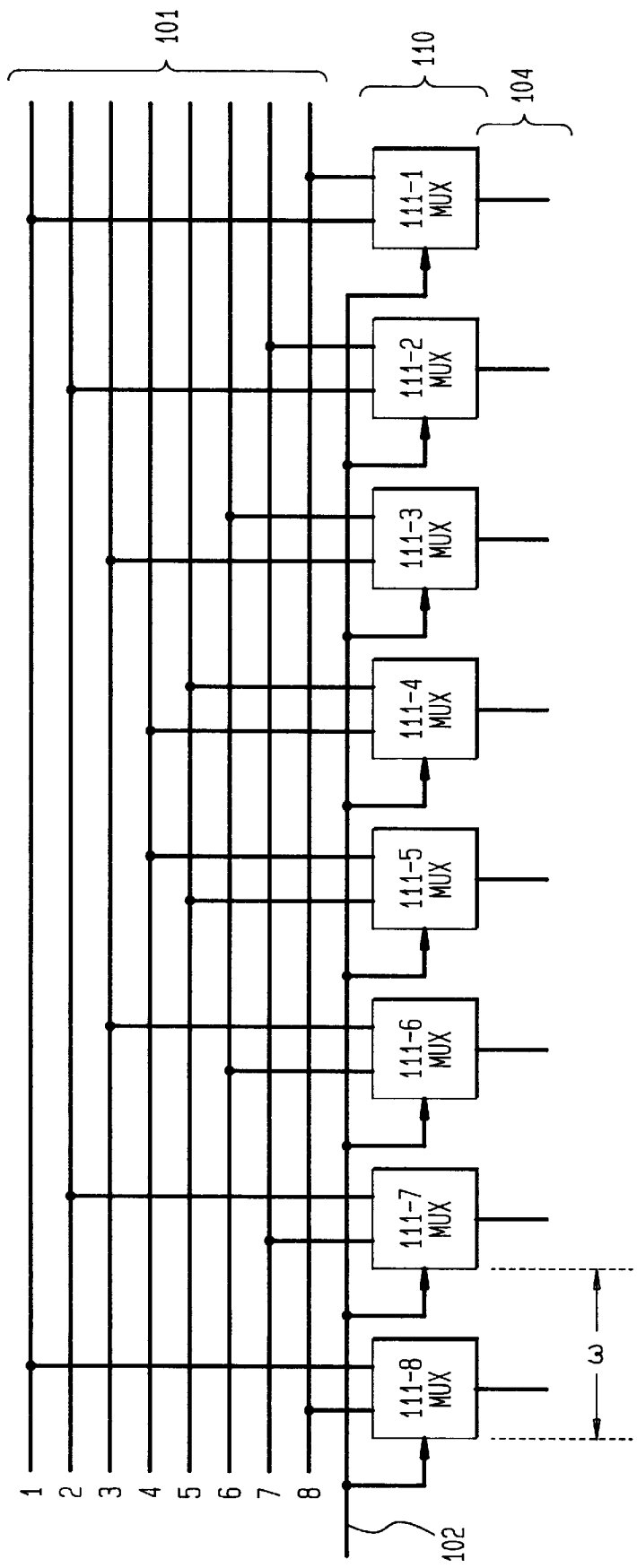
FIG. 5 depicts the input bit-reversing circuit of FIG. 3 in greater detail.

If the input bit-reversing circuit 110 is implemented on an IC chip then each of the n=8 subcircuits 111-1, . . . , 111-8 occupies a width w on the IC chip. The input data bus 101 therefore occupies a width approximately equal to n·w. In contrast, the input data bus 2a–2b or output data bus 7–8 of the conventional shifter circuit 1 (FIG. 1) must be approximately as wide as the combined width of the left and right shifter circuits 3 and 4 (which each have n subcircuits) or 2n·w (assuming that each subcircuit of the left and right shifter circuits 3 and 4 occupies the width w). As can be seen in FIG. 5, the reason for this difference in occupied width is that each of the n subcircuits 111-1, . . . , 111-8 is connected to 2 inputted bit lines of the bus 101 while each of the 2n subcircuits of the left and right shifter circuits 3 and 4 (FIG. 1) is connected to only one inputted bit line of the data bus 2a–2b or 7–8.

Each subcircuit 111-1, 111-2, . . . , 111-8 also receives the shift direction control signal via the line 102 as a selection control input. This signal may for instance be a logic '1' if one shift direction is chosen and a logic '0' if the opposite shift direction is chosen. Thus, if the shift direction control signal indicates the same shift direction as the shifter circuit 120 (FIG. 3), each $p^{th}$ subcircuit 111-p selects the corresponding $p^{th}$ bit of the inputted data word. If the shift direction control signal indicates the opposite shift direction as the shifter circuit 120 (FIG. 3), each $p^{th}$ subcircuit 111-p selects the $(n-p+1)^{th}$ bit of the inputted data word, thereby outputting the data word with the bits in reverse order to the shifter circuit 120 (FIG. 3).

Referring again to FIG. 3, the single-direction shifter circuit 120 receives the data word outputted from the input bit-reversing circuit 110 and the shift count m. The single-direction shifter circuit 120 then shifts the data word received from the input bit-reversing circuit 110 m bits in the direction of the shifter circuit 120. The shifted data word is then outputted to the output bit-reversing circuit 130.

The output bit-reversing circuit 130 works in a similar fashion to the input bit-reversing circuit 110. Thus, if the chosen shift direction is the same direction as the single-direction shifter circuit 120, the shifted data word received from the single-direction shifter circuit 120 is simply outputted with its bits in the same order as inputted to the output bit-reversing circuit 130. If the chosen shift direction is opposite to the direction of the single-direction shifter circuit 120, the shifted data word is outputted with its bits in reverse order.

An example is now discussed. Suppose the bidirectional shifter circuit 100 is an 8-bit shifter circuit with a left cyclic shifter circuit 120. Assume that it is desired to left shift the data word 'A B C D E F G H' by five bits. The data word is inputted on the bus 101, a signal indicating the left shift direction is inputted on the line 102 and the shift count 5 is inputted on the line 103. At the input bit-reversing circuit 110, the data word 'A B C D E F G H' is outputted because the chosen shift direction is the same as the shift direction of the left cyclic shifter circuit 120. The left cyclic shifter 120 shifts the data word five bits to the left and outputs the shifted data word 'F G H A B C D E'. The output bit-reversing circuit 130 receives the shifted data word and outputs this data word with the bits in the same order as received, i.e, 'F G H A B C D E.'

Now assume that it is desired to shift the data word 'A B C D E F G H' five bits to the right, i.e., in the direction opposite to the left cyclic shifter circuit 120. When the input bit-reversing circuit 110 receives the above data word and the shift direction signal, the input bit-reversing circuit 110 outputs the data word with the bits in reverse order, i.e., 'H G F E D C B A'. This reverse-order data word is inputted to the left cyclic shifter circuit 120 which outputs the left-shifted data word 'C B A H G F E D'. The shifted data word is inputted to the output bit-reversing circuit 130 which, in a similar fashion to the first bit-reversing circuit 110, reverses the ordering of the bits. That is, the output bit-reversing circuit 130 outputs the data word 'D E F G H A B C.' Now assume that the single-direction shifter circuit 120 is a left linear shifter circuit. Suppose it is desired to shift the data word 'A B C D E F G H' five bits to the right. The data word is inputted to the input bit-reversing circuit 110 which outputs the data word with the bits in reverse order, i.e., 'H G F E D C B A'. The left linear shifter circuit 120 receives this data word and shifts it to the left five bits. The left linear shifter circuit therefore outputs the data word 'C B A V W X Y Z' where the bits 'V W X Y Z' are, for example, all logic '0' or logic '1'. Alternatively, the bits 'V W X Y Z' are all the same logic value as the bit 'A' (formerly the sign bit). This shifted data word is received by the output bit-reversing circuit 130 which outputs the data word with the bits in reverse order, i.e., 'Z Y X W V A B C'.

Figure 6A:
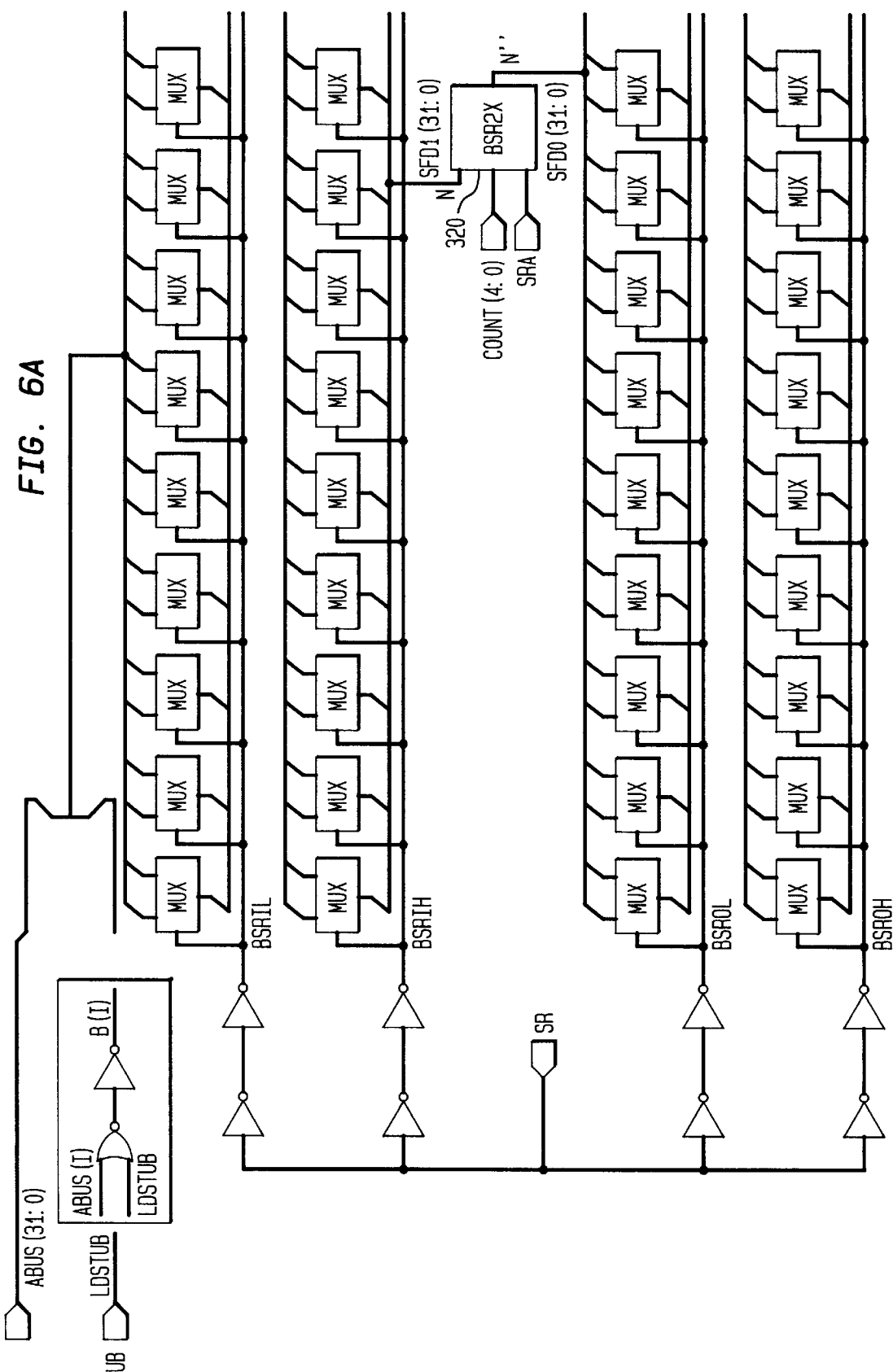
FIG. 6 depicts a circuit diagram of the input bit-reversing stage, the single direction shifter and the output bit-reversing stage in greater detail.

Referring to FIG. 6, a circuit diagram is shown for a 32 bit bidirectional arithmetic shifter 300 according to the present invention. As in FIG. 5, an input bit reversing stage 310 is formed from 2×1 multiplexers. Likewise, the output bit-reversing stage 330 is formed from 2×1 multiplexers. In between is a 32bit single direction shifter circuit 320. As discussed in greater detail below, the 32 bit single direction shifter circuit 320 can perform the requisite shift without decoding the shift count into one's complement form. In other words, only five data lines for the shift count need be formed for conveying the shift count to the individual multiplexers that implement the shift rather than thirty two as in prior art multiplexer shifters. This is important because shift count lines typically must be made of metal. Semiconductor metal lines have a minimum width which is much greater than the minimum resolution limits of the fabrication process. As such, it is desirable to reduce the number of metal lines that must be provided in any metal bus, even at the expense of increasing the number of transistors necessary to produce the requisite function, to conserve precious layout area on the semiconductor surface.

FIGS. 7(a) and 7(b) show a circuit diagram of the first and second multiplexer stages 322 and 324, respectively, of the single direction shifter circuit 320. As illustrated in FIG. 4, the first multiplexer stage 322 shifts the data word in increments of q bits. More specifically, the first multiplexer stage 322 receives the three most significant bits of the shift count COUNT, namely, bits COUNT4, COUNT3 and COUNT2. Depending on the values of these bits, the first multiplexer stage 322 shifts the input data word 0, 4, 8, 12, 16, 20, 24 or 28 bit positions. Mathematically speaking, the first multiplexer stage 322 shifts the input data word k·q bits where k=COUNT div q where n is the number of bits of the inputted data word and where "div" indicates the floor or nearest integer less than or equal to the quotient of n divided by q. To that end, the first multiplexer stage 322 has one multiplexer 322-31, 322-30, . . . , 322-0 corresponding to each bit $n_{31}$, $n_{30}$, . . . $n_0$, respectively, of the data word N inputted to the first multiplexer stage 322. Since the shifter 320 is an arithmetic shifter, the first multiplexer stage can only produce two possible outputs for the q most significant bits of the received data word N. As such 2×1 multiplexers 322-31, 322-30, 322-29 and 322-28 are provided for the q most significant bits $n_{31}$, $n_{30}$, $n_{29}$ and $n_{28}$. If any of the most significant three bits of the shift count are not logic '0', a special bit $n_{32}$ is outputted from each of these multiplexers 322-31, 322-30, 322-29 and 322-28. This special bit $n_{32}$ is either the logic '1'bit (having voltage Vdd) or the value of the most significant bit (bit $n_{31}$) of the inputted data word N depending on an externally supplied control signal SRA supplied by multiplexer 322-32. If the each of the three most significant bits of the shift count is logic '0', the multiplexer 322-31 outputs the most significant bit $n_{31}$ of the inputted data word, the multiplexer 322-30 outputs the second most significant bit $n_{30}$ of the inputted data word, etc.

For each other inputted bit $n_{27}$, $n_{26}$, . . . , $n_0$ of the inputted data word N (or shifted outputted data word N"), an 8×1 multiplexer 322-27, 322-26, . . . , 322-0, respectively, is provided. Depending on the value of the most significant bits of the shift count, one of eight possible shifts of q bits is performed by the first multiplexer stage. Each multiplexer 322-27, 322-26, . . . , 322-0 receives a sequence of eight bits of the inputted data word N which are selected by the respective shift count. These are summarized in the table 1 below:

TABLE 1

| | THREE MOST SIGNIFICANT BITS OF COUNT | | | | | | | |
|---|---|---|---|---|---|---|---|---|
| MUX | 000 | 001 | 010 | 011 | 100 | 101 | 110 | 111 |
| 322-27 | $n_{27}$ | $n_{31}$ | $n_{32}$ | $n_{32}$ | $n_{32}$ | $n_{32}$ | $n_{32}$ | $n_{32}$ |
| 322-26 | $n_{26}$ | $n_{30}$ | $n_{32}$ | $n_{32}$ | $n_{32}$ | $n_{32}$ | $n_{32}$ | $n_{32}$ |
| 322-25 | $n_{25}$ | $n_{29}$ | $n_{32}$ | $n_{32}$ | $n_{32}$ | $n_{32}$ | $n_{32}$ | $n_{32}$ |
| 322-24 | $n_{24}$ | $n_{28}$ | $n_{32}$ | $n_{32}$ | $n_{32}$ | $n_{32}$ | $n_{32}$ | $n_{32}$ |
| 322-23 | $n_{23}$ | $n_{27}$ | $n_{31}$ | $n_{32}$ | $n_{32}$ | $n_{32}$ | $n_{32}$ | $n_{32}$ |
| 322-22 | $n_{22}$ | $n_{26}$ | $n_{30}$ | $n_{32}$ | $n_{32}$ | $n_{32}$ | $n_{32}$ | $n_{32}$ |
| 322-21 | $n_{21}$ | $n_{25}$ | $n_{29}$ | $n_{32}$ | $n_{32}$ | $n_{32}$ | $n_{32}$ | $n_{32}$ |
| 322-20 | $n_{20}$ | $n_{24}$ | $n_{28}$ | $n_{32}$ | $n_{32}$ | $n_{32}$ | $n_{32}$ | $n_{32}$ |
| 322-19 | $n_{19}$ | $n_{23}$ | $n_{27}$ | $n_{31}$ | $n_{32}$ | $n_{32}$ | $n_{32}$ | $n_{32}$ |
| 322-18 | $n_{18}$ | $n_{22}$ | $n_{26}$ | $n_{30}$ | $n_{32}$ | $n_{32}$ | $n_{32}$ | $n_{32}$ |
| 322-17 | $n_{17}$ | $n_{21}$ | $n_{25}$ | $n_{29}$ | $n_{32}$ | $n_{32}$ | $n_{32}$ | $n_{32}$ |
| 322-16 | $n_{16}$ | $n_{20}$ | $n_{24}$ | $n_{28}$ | $n_{32}$ | $n_{32}$ | $n_{32}$ | $n_{32}$ |
| 322-15 | $n_{15}$ | $n_{19}$ | $n_{23}$ | $n_{27}$ | $n_{31}$ | $n_{32}$ | $n_{32}$ | $n_{32}$ |
| 322-14 | $n_{14}$ | $n_{18}$ | $n_{22}$ | $n_{26}$ | $n_{30}$ | $n_{32}$ | $n_{32}$ | $n_{32}$ |
| 322-13 | $n_{13}$ | $n_{17}$ | $n_{21}$ | $n_{25}$ | $n_{29}$ | $n_{32}$ | $n_{32}$ | $n_{32}$ |
| 322-12 | $n_{12}$ | $n_{16}$ | $n_{20}$ | $n_{24}$ | $n_{28}$ | $n_{32}$ | $n_{32}$ | $n_{32}$ |
| 322-11 | $n_{11}$ | $n_{15}$ | $n_{19}$ | $n_{23}$ | $n_{27}$ | $n_{31}$ | $n_{32}$ | $n_{32}$ |
| 322-10 | $n_{10}$ | $n_{14}$ | $n_{18}$ | $n_{22}$ | $n_{26}$ | $n_{30}$ | $n_{32}$ | $n_{32}$ |
| 322-9 | $n_9$ | $n_{13}$ | $n_{17}$ | $n_{21}$ | $n_{25}$ | $n_{29}$ | $n_{32}$ | $n_{32}$ |
| 322-8 | $n_8$ | $n_{12}$ | $n_{16}$ | $n_{20}$ | $n_{24}$ | $n_{28}$ | $n_{32}$ | $n_{32}$ |
| 322-7 | $n_7$ | $n_{11}$ | $n_{15}$ | $n_{19}$ | $n_{23}$ | $n_{27}$ | $n_{31}$ | $n_{32}$ |
| 322-6 | $n_6$ | $n_{10}$ | $n_{14}$ | $n_{18}$ | $n_{22}$ | $n_{26}$ | $n_{30}$ | $n_{32}$ |
| 322-5 | $n_5$ | $n_9$ | $n_{13}$ | $n_{17}$ | $n_{21}$ | $n_{25}$ | $n_{29}$ | $n_{32}$ |
| 322-4 | $n_4$ | $n_8$ | $n_{12}$ | $n_{16}$ | $n_{20}$ | $n_{24}$ | $n_{28}$ | $n_{32}$ |
| 322-3 | $n_3$ | $n_7$ | $n_{11}$ | $n_{15}$ | $n_{19}$ | $n_{23}$ | $n_{27}$ | $n_{31}$ |
| 322-2 | $n_2$ | $n_6$ | $n_{10}$ | $n_{14}$ | $n_{18}$ | $n_{22}$ | $n_{26}$ | $n_{30}$ |
| 322-1 | $n_1$ | $n_5$ | $n_9$ | $n_{13}$ | $n_{17}$ | $n_{21}$ | $n_{25}$ | $n_{29}$ |
| 322-0 | $n_0$ | $n_4$ | $n_8$ | $n_{12}$ | $n_{16}$ | $n_{20}$ | $n_{24}$ | $n_{28}$ |

Generally speaking, each 8×1 multiplexer receives a sequence of bits including the corresponding input bit (e.g., the multiplexer 322-1 receives the input bit $n_1$,) and each bit located q=4 bit positions from a preceding bit in the sequence (e.g., the multiplexer 322-1 also receives the bits $n_5$, which is q=4 bit positions from $n_1$, $n_9$, which is four bit positions from $n_5$, etc.). However, because this is an arithmetic shifter, the sequential counting of bit positions does not wrap around from bit $n_{31}$ back to $n_0$. Rather, each multiplexer 322-4, . . . , 322-31, receives a subsequence of bit $n_{32}$ in place of each bit exceeding bit position $113_1$. Thus, each bit outputted by each 8×1 multiplexer 322-31, 322-30, . . . , 322-0 corresponds to the data word as arithmetically shifted by k·q bit positions. For instance, suppose the input data word N is:

$n_{31}n_{30}n_{29}n_{28}n_{27}n_{26}n_{25}n_{24}n_{23}n_{22}n_{21}n_{20}n_{19}n_{18}n_{17}n_{16}n_{15}$
$n_{14}n_{13}n_{12}n_{11}n_{10}n_9n_8n_7n_6n_5n_4n_3n_2n_1n_0$ and the shift count COUNT=13. The three most significant bits of the shift count COUNT, namely, COUNT4, COUNT3 and COUNT2 are '011'. As such, the multiplexers 322-31, . . . , 322-20 output $n_{32}$ as the 11 most significant bits, the multiplexer 322-19 outputs the bit $n_{31}$ as the 12$^{th}$ most significant bit, the multiplexer 322-18 outputs the bit $n_{30}$ as the 13$^{th}$ most significant bit, . . . , the multiplexer 322-0 outputs the bit $n_{12}$ as the least significant bit to produce the shifted data word N' with bits $n'_{31}n'_{30}$. . . $n'_0$ as follows:

$n_{32}n_{32}n_{32}n_{32}n_{32}n_{32}n_{32}n_{32}n_{32}n_{32}n_{32}n_{31}n_{30}n_{29}n_{28}n_{27}n_{26}$
$n_{25}n_{24}\ n_{23}\ n_{22}n_{21}n_{20}n_{19}n_{18}n_{17}n_{16}n_{15}n_{14}n_{13}n_{12}$

Referring to FIG. 7(b), the second stage multiplexer 324 is shown including 32 4×1 multiplexers 324-31, 324-30, . . . , 324-0. Each of the 4×1 multiplexers 324-31, 324-30, . . . , 324-0 corresponds to a respective bit position n"$_{31}$, n"$_{30}$, . . . n"$_0$ of the finally shifted output data word N" of the second multiplexer stage 324, the 4×1 multiplexer 324-31 corresponding to bit n"$_{31}$, the 4×1 multiplexer 324-30 corresponding to bit n"$_{30}$, etc. Each 4×1 multiplexer 324-31, 324-30, . . . , 324-0 receives the two least significant bits of the shift count COUNT1 and COUNT0 as selection control signals. Furthermore, each of the 4×1 multiplexers 324-31, 324-30. . ., 324-0 receives four selectable input bits. In particular, each 4×1 multiplexer 324-31, 324-30, . . . , 324-0 receives a sequence of bits including a corresponding inputted bit n'$_{31}$, n'$_{30}$, . . . , n'$_0$, respectively, and an increasing subsequence of the next three bits. Again, because the shifter 300 is an arithmetic shifter, the counting of sequential bits does not wrap from bit n'$_{31}$, to n'$_0$. Rather, the bit $n_{32}$ is substituted for each bit in positions exceeding the bit position of bit n'$_{31}$ in multiplexers 324-31, 324-30 and 324-29. The sequences of four bits supplied to each multiplexer 324-31, 324-30, . . . , 324-0 are summarized in table 2 below:

TABLE 2

| | LEAST TWO SIGNIFICANT BITS OF SHIFT COUNT | | | |
|---|---|---|---|---|
| MUX | 00 | 01 | 10 | 11 |
| 324-31 | n'$_{31}$ | n'$_{32}$ | n'$_{32}$ | n'$_{32}$ |
| 324-30 | n'$_{30}$ | n'$_{31}$ | n'$_{32}$ | n'$_{32}$ |
| 324-29 | n'$_{29}$ | n'$_{30}$ | n'$_{31}$ | n'$_{32}$ |
| 324-28 | n'$_{28}$ | n'$_{29}$ | n'$_{30}$ | n'$_{31}$ |
| 324-27 | n'$_{27}$ | n'$_{28}$ | n'$_{29}$ | n'$_{30}$ |
| 324-26 | n'$_{26}$ | n'$_{27}$ | n'$_{28}$ | n'$_{29}$ |
| 324-25 | n'$_{25}$ | n'$_{26}$ | n'$_{27}$ | n'$_{28}$ |
| 324-24 | n'$_{24}$ | n'$_{25}$ | n'$_{26}$ | n'$_{27}$ |
| 324-23 | n'$_{23}$ | n'$_{24}$ | n'$_{25}$ | n'$_{26}$ |
| 324-22 | n'$_{22}$ | n'$_{23}$ | n'$_{24}$ | n'$_{25}$ |
| 324-21 | n'$_{21}$ | n'$_{22}$ | n'$_{23}$ | n'$_{24}$ |
| 324-20 | n'$_{20}$ | n'$_{21}$ | n'$_{22}$ | n'$_{23}$ |
| 324-19 | n'$_{19}$ | n'$_{20}$ | n'$_{21}$ | n'$_{22}$ |
| 324-18 | n'$_{18}$ | n'$_{19}$ | n'$_{20}$ | n'$_{21}$ |
| 324-17 | n'$_{17}$ | n'$_{18}$ | n'$_{19}$ | n'$_{20}$ |
| 324-16 | n'$_{16}$ | n'$_{17}$ | n'$_{18}$ | n'$_{19}$ |
| 324-15 | n'$_{15}$ | n'$_{16}$ | n'$_{17}$ | n'$_{18}$ |
| 324-14 | n'$_{14}$ | n'$_{15}$ | n'$_{16}$ | n'$_{17}$ |
| 324-13 | n'$_{13}$ | n'$_{14}$ | n'$_{15}$ | n'$_{16}$ |
| 324-12 | n'$_{12}$ | n'$_{13}$ | n'$_{14}$ | n'$_{15}$ |
| 324-11 | n'$_{11}$ | n'$_{12}$ | n'$_{13}$ | n'$_{14}$ |
| 324-10 | n'$_{10}$ | n'$_{11}$ | n'$_{12}$ | n'$_{13}$ |
| 324-9 | n'$_9$ | n'$_{10}$ | n'$_{11}$ | n'$_{12}$ |
| 324-8 | n'$_8$ | n'$_9$ | n'$_{10}$ | n'$_{11}$ |
| 324-7 | n'$_7$ | n'$_8$ | n'$_9$ | n'$_{10}$ |
| 324-6 | n'$_6$ | n'$_7$ | n'$_8$ | n'$_9$ |
| 324-5 | n'$_5$ | n'$_6$ | n'$_7$ | n'$_8$ |
| 324-4 | n'$_4$ | n'$_5$ | n'$_6$ | n'$_7$ |
| 324-3 | n'$_3$ | n'$_4$ | n'$_5$ | n'$_6$ |
| 324-2 | n'$_2$ | n'$_3$ | n'$_4$ | n'$_5$ |
| 324-1 | n'$_1$ | n'$_2$ | n'$_3$ | n'$_4$ |
| 324-0 | n'$_0$ | n'$_1$ | n'$_2$ | n'$_3$ |

Continuing with the above example, suppose the shifted data word N', with bits n'$_{31}$n'$_{30}$. . . n'$_0$:

$n_{32}n_{32}n_{32}n_{32}n_{32}n_{32}n_{32}n_{32}n_{32}n_{32}n_{32}n_{31}n_{30}n_{29}n_{28}n_{27}n_{26}$
$n_{25}n_{24}\ n_{23}\ n_{22}n_{21}n_{20}n_{19}n_{18}n_{17}n_{16}n_{15}n_{14}n_{13}n_{12}$ is outputted from the first multiplexer stage 322 to the second multiplexer stage 324 in response to the three most significant bits of the shift count COUNT=13. The bits $n_{15}n_{14}n_{13}n_{12}$are received as selectable bits n'$_3$n'$_2$n'$_1$n'$_0$ at the first 4×1 multiplexer 324-0, the bits $n_{16}n_{15}n_{14}n_{13}$ are received as selectable bits n'$_4$n'$_3$n'$_2$n'$_1$ at the second 4×1 multiplexer 324-1, the bits $n_{17}n_{16}n_{15}n_{14}$are received as selectable bits n'$_5$n'$_4$n'$_3$n'$_2$ at the third 4×1 multiplexer 324-2, and so on. The least two significant bits of the shift count COUNT, namely, COUNT1 and COUNT0, are '01'. As a result, the second stage multiplexers 324 collectively output the finally shifted data word N" with bits n41$_{31}$n"$_{30}$ . . . n"$_0$ as follows:

$n_{32}n_{32}n_{32}n_{32}n_{32}n_{32}n_{32}n_{32}n_{32}n_{32}n_{32}n_{32}n_{31}n_{30}n_{29}n_{28}n_{27}$
$n_{26}n_{25}n_{24}\ n_{23}\ n_{22}n_{21}n_{20}n_{19}n_{18}n_{17}n_{16}n_{15}n_{14}n_{13}$

Figure 8:
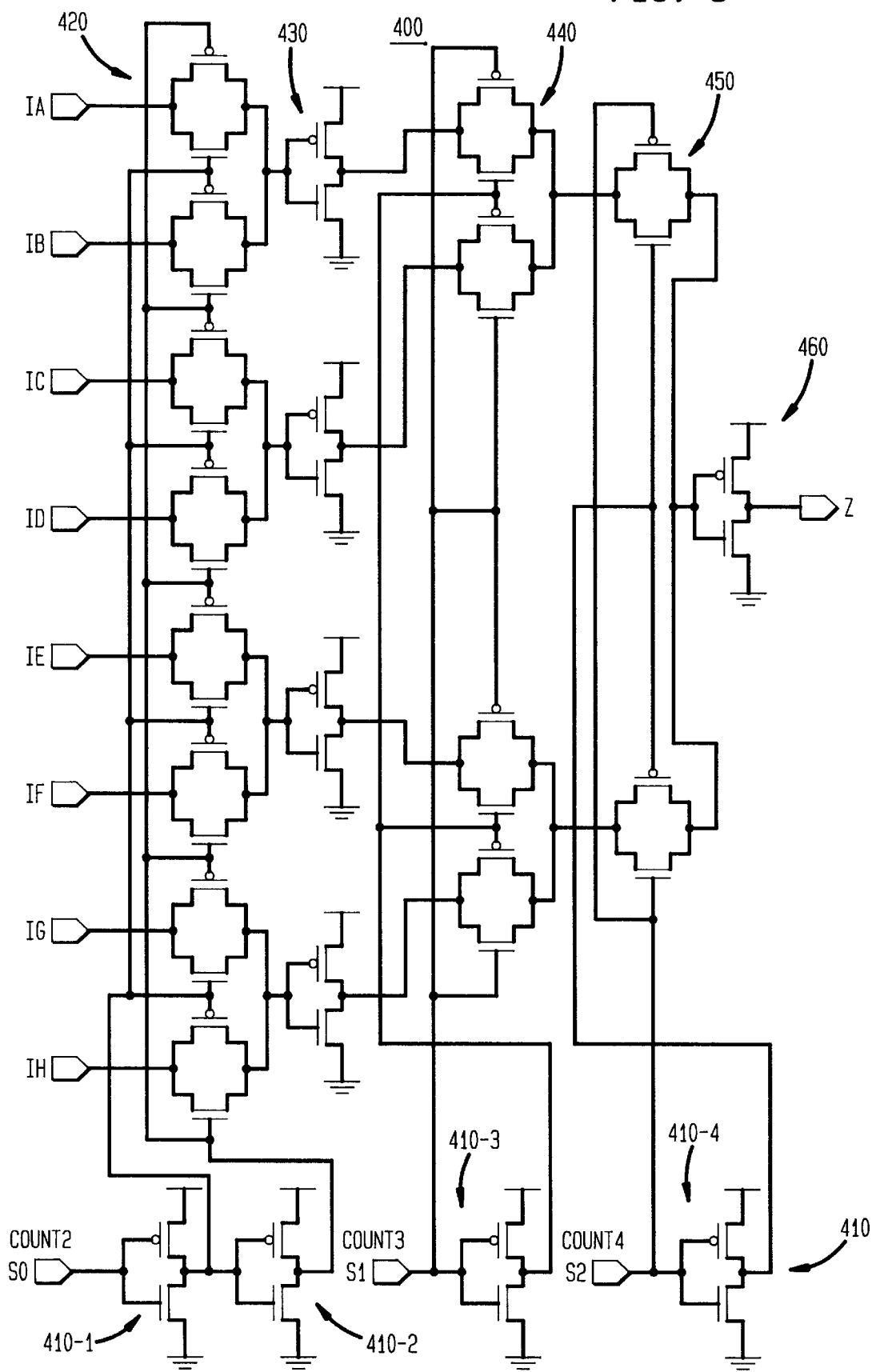
FIG. 8 depicts an 8×1 multiplexer in greater detail.

Referring now to FIG. 8, a circuit diagram is shown for an 8×1 multiplexer 400, such as the multiplexers 322-27, 322-26, . . . ,322-0. As noted above, the 8×1 multiplexer circuit receives the three most significant bits of the shift count and selects one of a sequence of eight inputted data word bits. As shown, the 8×1 multiplexer includes a control signal generation substage 410 including multiple CMOS push-pull configuration inverters 410-1, 410-2, 410-3 and 410-4. The three most significant bits of the shift count COUNT4, COUNT3 and COUNT2 are received at inverter 410-4, 410-3 and 410-1, respectively. The inverter 410-1 inverts the shift count bit COUNT2 to produce the complement of the shift count bit COUNT2'. The complement of the shift count bit COUNT2' is fed to inverter 410-2 which outputs the uncomplemented shift count bit COUNT2. The inverter 410-3 produces the complement of the shift count bit COUNT3'. Likewise, the inverter 410-4 produces the complement of the shift count bit COUNT4'The 8×1 multiplexer 400 achieves the selection of a single input bit in three separate substages, namely, an 8:4 multiplexer substage 420, a 4:2 multiplexer substage 440 and a 2:1 multiplexer substage 450. In the 8:4 multiplexer substage 420, four of the eight bits inputted to the 8×1 multiplexer 400 are selected for output. In the 4:2 multiplexer substage 440, two of the four bits outputted by the 8:4 multiplexer substage 420 are selected for output. Finally, in the 2:1 multiplexer substage 450, one of the two bits outputted by the 4:2 multiplexer substage 440 is selected for output (as bit Z).

Note that the architecture shown in FIGS. 7(a), 7(b) and 8 is somewhat arbitrary and depends on the selection of q. In general where the first multiplexer stage 322 (FIG. 7(a)) performs a shift of k·q bit positions on an inputted data word, the multiplexers corresponding to at least n−q of the bit positions (the least significant n−q bit positions for a right shifter) are a×1 multiplexers where a=n/q. According to an embodiment of the present invention, an a×1 multiplexer performs its shift in $\log_2 a$ substages wherein each substage receives a corresponding one of $\log_2(n/q)$ most significant bits of the shift count COUNT. The first substage is an a:b multiplexer substage where b=a/2. The second substage (if present) is a b:c multiplexer substage where c=b/2. The third substage (if present) is a c:d multiplexer substage where d=c/2, etc.

The a=8:b=4 multiplexer substage 420 receives a sequence of a=8 inputted bits, e.g., a bit $n_i$ and every $q^{th}$ bit $n_{i+q}, n_{i+2q}, \ldots, n_{i+(a-1)q}$ of the inputted data word therefrom, on input lines IA, IB, IC, ID, IE, IF, IG and IH. In response to the third most significant bit of the count COUNT2, and its complement, as provided by the control signal substage 410, the 8:4 multiplexer substage 420 selects either the bits on input lines IA, IC, IE and IG (every odd bit of the sequence of eight bits) or the bits on input lines IB, ID, IF and IH (every even bit of the sequence of eight bits). To achieve this, the 8:4 multiplexer substage 420 has a=8 CMOS pass transistor pairs, such as PMOS transistor P0 and NMOS transistor N1. Each of the input lines, e.g., input line IA, is connected to the sources of each transistor of the CMOS pass transistor pair, i.e., transistors P0 and N1. For each CMOS pass transistor pair receiving an odd bit (i.e., pairs N1–P0, N4–P5, N8–P9, N12–P13 connected to input lines IA, IC, IE or IG) the gate of the NMOS transistor N1, N4, N8 or N12 receives the complement of the shift count bit, i.e., COUNT2'. The gate of the PMOS transistor P0, P5, P9 or P13 receives the uncomplemented shift count bit, i.e., COUNT2. Thus, if COUNT2 is a logic '1', neither transistor of the pair conducts and no signal is outputted on the drains of the CMOS pass-gate transistor pair. On the other hand, if COUNT2 is a logic '0'both transistors of the pair conducts and the signal on the respective input line IA, IC, IE or IG is outputted on the drains of the transistors of the pair (which are commonly connected together). For each pair of CMOS pass transistor pair receiving an even bit (i.e., pairs N2≧P3, N6–P7, N10–P11, or N14–P15 connected to input lines IB, ID, IF or IH) the gate of the NMOS transistor N2, N6, N10 or N14 receives the uncomplemented shift count bit, i.e., COUNT2. The gate of the PMOS transistor P3, P7, P11 or P15 receives the complemented shift count bit, i.e., COUNT2'. Thus, if COUNT2 is a logic '0', neither transistor of the pair conducts and no signal is outputted on the drains of the CMOS pass-gate transistor pair. On the other hand, if COUNT2 is a logic '1' both transistors of the pair conducts and the signal on the respective input line IB, ID, IF or IH is outputted on the drains of the transistors of the pair (which are commonly connected together).

The output of each CMOS pass transistor pair receiving an odd bit of the sequence is connected to the output of the CMOS pass transistor pair receiving the next increasing even bit of the sequence. That is, the drains of pair N1–P0 receiving the first bit of the sequence on line IA are connected to the same output as the drains of the pair N2–P3 receiving the second bit of the sequence on line IB, and so on.

The b=4 bits outputted from the 8:4 multiplexer substage 420 are inverted and amplified by intermediate driver substage 430 which includes b=4 CMOS push-pull inverters 430-1, 430-2, 430-3 and 430-4. Each inverter 430-1, 430-2, . . . , 430-4 receives, inverts and amplifies a different one of the outputted bits.

Each of the b=4 bits are received at the b=4:c=2 multiplexer substage 440. Like the 8:4 multiplexer substage 420, the 4:2 multiplexer substage 440 includes b=4 CMOS pass transistor pairs, including one pass transistor pair for each received bit. A selection of the bits is made in response to receiving the uncomplemented and complemented second most significant bits of the shift count COUNT3 and COUNT3', respectively. The outputs of the CMOS pass transistor pairs are themselves paired in an odd-even fashion as in the 8:4 multiplexer substage 420 (e.g., the output of the pair N49–P51 is connected to the output of the pair N50–P52).

Each of the c=2 bits outputted from the 4:2 multiplexer substage 440 are received at the c=2:d=1 multiplexer substage 450. The 2:1 multiplexer substage 450 includes c=2 CMOS pass transistor pairs that have their outputs commonly connected together. A selection of the inputted bits is made in response to receiving the uncomplemented and complemented most significant bits of the shift count COUNT4 and COUNT4' respectively.

Note that the 4:2 multiplexer substage 440 can be viewed as two parallel 2:1 multiplexer substages 450. Likewise, the 8:4 multiplexer substage 420 can be viewed as two parallel 4:2 multiplexer substages 440.

The d=1 bit outputted from the 2:1 multiplexer substage 450 is inverted and amplified by output driver substage 460 which can be formed as a CMOS push-pull inverter. Since the bits inputted to the 8×1 multiplexer 400 are inverted twice, the outputted bit is uncomplemented.

Note that the 8×1 multiplexer 400 need only receive three shift count bits, namely, COUNT4, COUNT3 and COUNT2. This is important because a bus of only three bit lines need be laid out over the multiplexers 322-31, 322-30, . . . , 322-0 of the first stage 322 (FIG. 7(a)). Thus, area consuming metal bus lines are reduced in number. Such a design is possible because the shift count decoder is eliminated in the single direction shifter 320 architecture. While this tends to complicate the design of the first and second shifter stages 322 and 324, overall area and space are saved.

Consider now the above example, wherein an inputted data word N is shifted COUNT=13 bit positions. Suppose that the multiplexer 400 is the multiplexer 322-22 (FIG. 7(a)). In such a case, the input signal lines receive the following sequence of bits: $IA=n_{22}, IB=n_{26}, IC=n_{30}, ID=IE= IF=IG=IH=n_{32}$ and COUNT2='1', COUNT3='0' and COUNT4='1' Because COUNT2='1', the 8:4 multiplexer substage 420 outputs the signals $IB=n_{26}, ID=n_{32}, IF=n_{32}$ and $IH=n_{32}$. These intermediate driver substage 430 inverts the outputted bits. The multiplexer substage 440 outputs the bits $IB'=n_{26}'$ and $IF'=n_{32}'$ because COUNT3='0'. The multiplexer substage 450 outputs the bit $IF'=n_{32}'$ because COUNT4='1'. The driver substage 460 inverts the bit to produce $IF=n_{32}$.

Figure 9:
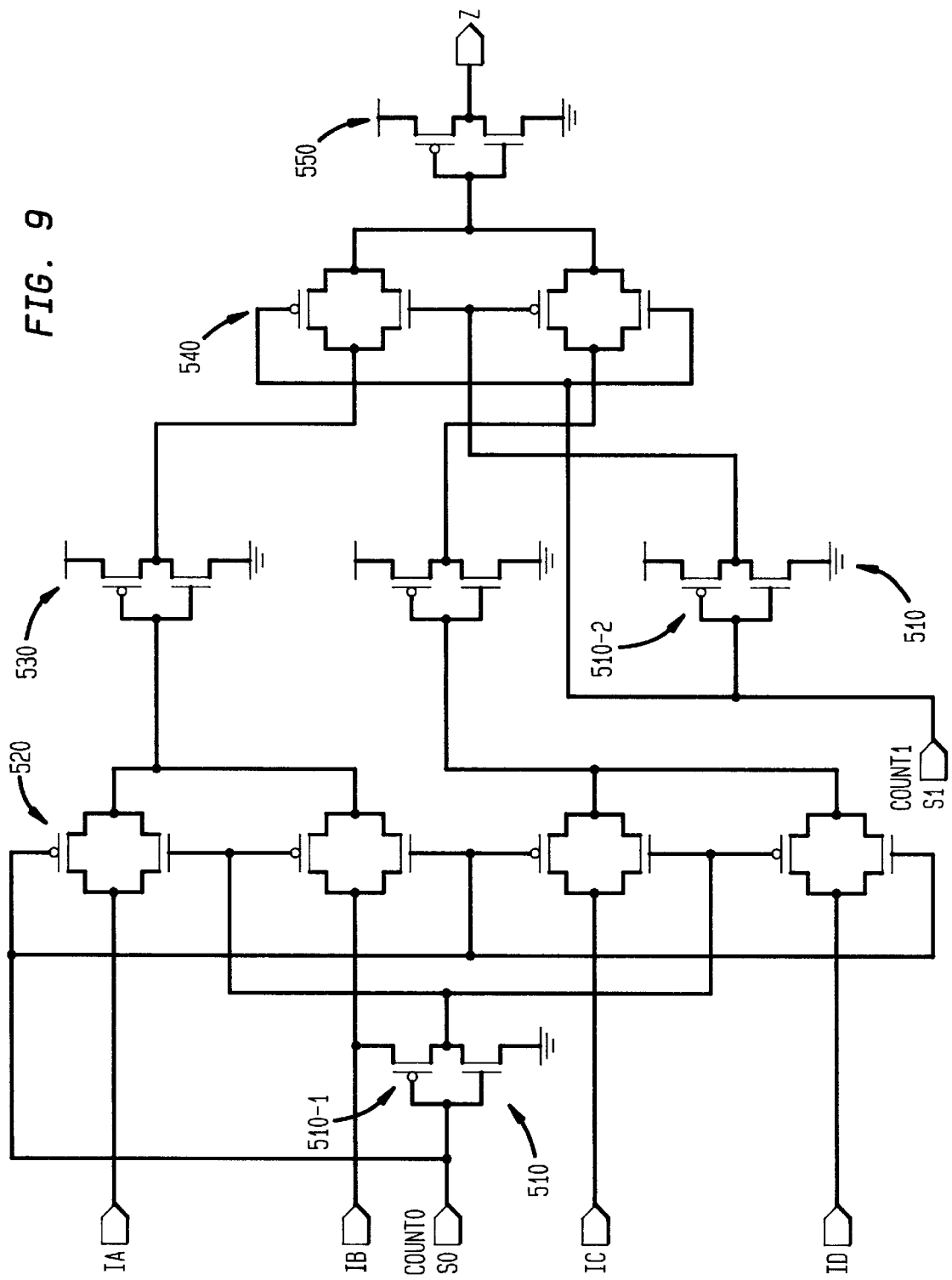
FIG. 9 depicts a 4×1 multiplexer in greater detail.

Referring to FIG. 9 a circuit diagram is shown for a 4×1 multiplexer 500. The 4×1 multiplexer 500 is very similar in architecture to the 8×1 multiplexer 400 of FIG. 8 and is only briefly reviewed. The 4×1 multiplexer includes a control signal generation substage 510 including inverter 510-1, which receives the least significant bit of the shift count COUNT0, and inverter 510-2, which receives the second least significant bit of the shift count COUNT1. The inverter 510-1 generates the complement of the shift count bit COUNT0' and the inverter 510-2 generates the complement of the shift count bit COUNT1'.

As above, the choice of 4×1 multiplexers is arbitrary and depends on q. If the second stage is to perform shifting of 0 to q−1 bit positions, then the $\log_2 q$ least significant bits of the shift count COUNT are needed. A q×1 multiplexer is needed to perform the shift. The shift is performed in $\log_2 q$ substages wherein each substage receives a different one of the $\log_2 q$ bits of the shift count.

The 4×1 selection is performed in two steps. A sequence of four input bits are received at a b=4:c=2 multiplexer substage 520 on lines IA, IB, IC and ID, respectively, such as outlined in table 2. In response to the least significant bit of the shift count COUNT0 either each bit in an odd bit position of the sequence, i.e., on lines IA and IC, or each bit in an even bit position of the sequence, i.e., on lines IB and ID is selected. The selected c=2 bits are inverted and amplified in intermediate driver substage 530. The inverted, amplified selected c=2 bits are received at a c=2:d=1 multiplexer substage 540. In response to the second least significant bit of the shift count COUNT1, the 2:1 multiplexer substage 540 selects one of the c=2 received bits. This selected bit is inverted by the driver stage 550 and is therefore outputted in uncomplemented form. The substage 520 is similar to the substage 440 in architecture and operation. Likewise, the substage 540 is similar in architecture and operation to the substage 450.

Consider now the above example of shifting an input data word N by shift count COUNT=13 bit positions. Suppose the data word N' as shifted 12 bit positions is received at the second multiplexer stage 324 from the first multiplexer stage. Furthermore, assume that the 4×1 multiplexer 520 is the multiplexer 324-2. As such, the following sequence of bits is received: $ID=n_{17}, IC=n_{16}, IB=n_{15}$, and $IA=n_{14}$, and COUNT1='0' and COUNT0='1'. Because COUNT0='1', the b=4:c=2 multiplexer substage 520 outputs the bits $IB=n_{15}$ and $ID=n_{17}$. The intermediate driver substage 530 inverts these bits to produce $IB'=n_{15}'$ and $ID'=n_{17}'$. Because COUNT1='0', the c=2:d=1 multiplexer substage 540 selects the bit $IB'=n_{15}'$. The driver substage 550 inverts the bit IB' to produce $IB=n_{15}$.

Figure 10:
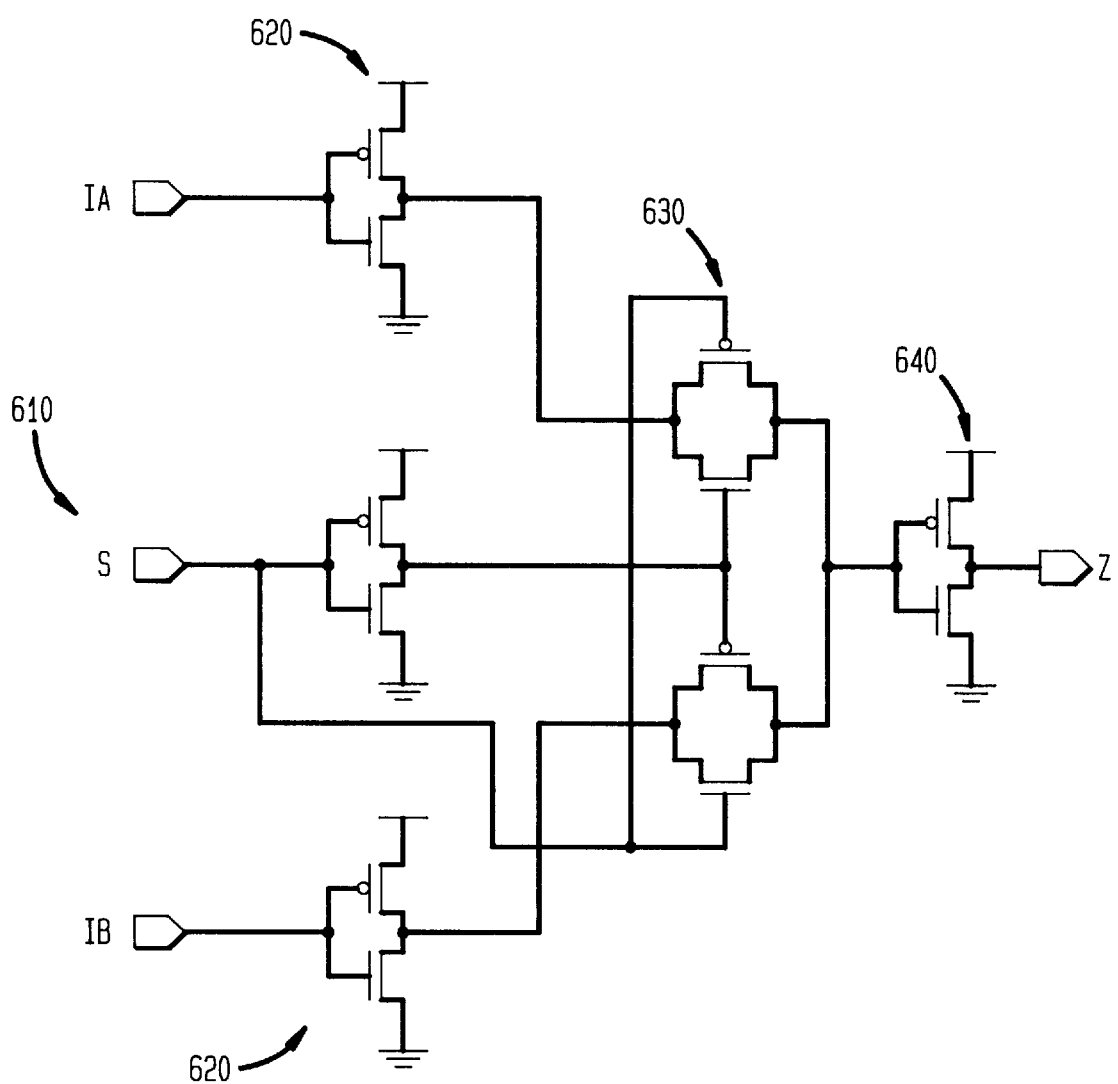
FIG. 10 depicts a 2×1 multiplexer in greater detail.

FIG. 10 shows a 2×1 multiplexer 600 which is very similar in architecture and operation as the 8×1 multiplexer 400 and the 4×1 multiplexer 500. The 2×1 multiplexer has a select control signal generator substage 610, an intermediate driver substage 620, a c=2:d=1 multiplexer substage 630 and an output driver substage 640.

In short, a bidirectional shifter circuit is disclosed which includes two bit-reversing circuits and one single-direction shift register. Unlike the prior art circuits, the inventive bidirectional shifter circuit does not require a second single-direction shifter circuit, an adder circuit which slows down the processing speed of the shifter or a mask circuit for computing a linear shift. Thus, space is conserved by providing fewer circuits and in laying out the conductors of the input bus 101 to the bit-reversing circuit 110.

Although the above invention has been described with reference to specific embodiments, this was only illustrative. Numerous other embodiments may be devised by those having ordinary skill in the art without departing from the spirit and scope of the following claims.

The claimed invention is:

1. A bidirectional shifter circuit for shifting an inputted data word having n bits a chosen number of bit positions COUNT in either a first or second chosen direction comprising:

a first bit-reversing circuit for, in response to choosing said first direction, outputting said inputted data word with the bits of said data word in order, and, in response to choosing said second direction, outputting said data word with said bits in reverse order, a single-direction shifter circuit connected to said first bit-reversing circuit for shifting said bits of said outputted data word said COUNT bit positions in said first direction, and a second bit-reversing circuit connected to said shifter circuit for, in response to choosing said first direction, outputting said data word received from said single-direction shifter circuit with said bits of said data word in the same order as received from said single-direction shifter circuit, and, in response to choosing said second direction, outputting said data word with said bits in reverse order, wherein said single-direction shifter circuit comprises:

a first multiplexer stage for shifting said data word k·q bit positions, where q is an integer>1 and where k=COUNT div q, where div indicates the nearest integer less than or equal to the quotient of n divided by q, said first multiplexer stage receiving only the $\log_2(n/q)$ most significant bits of COUNT as selection control inputs, and a second multiplexer stage for further shifting said shifted data word outputted from said first multiplexer stage 0 to q−1 bit positions, said second multiplexer stage receiving only the $\log_2 q$ least significant bits of COUNT as selection control inputs, wherein said first and second multiplexer stages are comprised of multiplexer substages, each said multiplexer substage comprising a plurality of NMOS and PMOS paired pass transistors, including one pair of pass transistors for each bit inputted to said multiplexer substage, wherein said sources of each transistor of each pair are connected to a signal line receiving a corresponding inputted bit of said multiplexer substage, wherein for each pair of pass transistors corresponding to an odd bit positioned inputted bit, said NMOS transistor receives at its gate a complement of said respective selection control signal and said PMOS transistor receives at its gate said selection control signal, and, wherein for each pair of pass transistors corresponding to an even positioned inputted bit, said NMOS transistor receives at its gate said respective selection control signal and said PMOS transistor receives at its gate said complement of said selection control signal.

2. The bidirectional shifter of claim 1 wherein said first multiplexer stage comprises a plurality of at least (n−q) a:b multiplexer substages and a plurality of b:c multiplexer substages, wherein each one of said b:c multiplexer substages corresponds to one of said a:b multiplexer substages, where a, b, and c are integers, a=n/q, b=a/2, c=b/2, wherein each of said a:b multiplexer substages receives a sequence of a bits of said data word as a input bits, and in response to a second most significant bit of COUNT, selects b of said a input bits as output bits, and wherein each of said b:c multiplexer substages receives said b output bits from a corresponding a:b multiplexer substage as b input bits, and in response to a most significant bit of COUNT, selects c of said b input bits for output, and wherein said second multiplexer stage comprises a plurality of b:c multiplexer substages and a plurality of c:d multiplexer substages, wherein each one of said c:d multiplexer substages corresponds to one of said b:c multiplexer substages, where b, c and d are integers, b=q, c=b/2 and d=c/2, wherein each of said b:c multiplexer substages receives a sequence of said output bits from said first multiplexer stage as b input bits, and in response to a least significant bit of COUNT, selects c of said b input bits as output bits, and wherein each of said c:d multiplexer substages receives said c output bits from a corresponding b:c multiplexer substage as c input bits, and in response to a second least significant bit of COUNT, selects d of said c input bits as output bits.

3. The bidirectional shifter of claim 2 wherein said first multiplexer further comprises a plurality of c:d multiplexer substages, wherein each one of said first multiplexer c:d multiplexer substages corresponds to one of said first multiplexer b:c multiplexer substages, where d is an integer and d=c/2, and wherein each of said first multiplexer c:d multiplexer substages receives said c output bits from a corresponding b:c multiplexer substage as c input bits, and in response to a most significant bit of COUNT, selects d of said c input bits as output bits, and wherein said first multiplexer a:b substage receives a third most significant bit of COUNT, and wherein said first multiplexer b:c substage receives a second most significant bit of COUNT.

4. The bidirectional shifter circuit of claim 2 wherein said sequence of a bits of said data word inputted to each of said a:b multiplexer substages includes one bit corresponding to a respective one of said a:b multiplexer substages, and also each bit of said data word at a $q^{th}$ bit position from a preceding bit of said sequence of a bits, each bit of said sequence of a bits being received at a respective one of said a inputs.

5. The bidirectional shifter circuit of claim 2 wherein said shifted data word outputted from said first multiplexer stage as b inputs to said b:c multiplexer substages of said second multiplexer stage, includes a corresponding one of said shifted data word bits and each bit of said shifted data word at a sequential bit position from a preceding bit of said shifted data word, each bit of said shifted data word being received at a respective one of said b inputs.

6. The bidirectional shifter circuit of claim 1 wherein said single-direction shifter circuit is a cyclic shifter circuit.

7. The bidirectional shifter circuit of claim 1 wherein said single-direction shifter circuit is a linear shifter circuit.

8. A single-direction shifter circuit comprising a byte shift multiplexer stage with its output connected to a bit shift multiplexer stage, wherein each of said multiplexer stages comprises a plurality of NMOS and PMOS paired pass transistors, including one pair of pass transistors for each bit inputted to said multiplexer stages, wherein the sources of each said transistor of each pair are connected to a signal line receiving a corresponding inputted bit of said multiplexer stages, wherein for each pair of pass transistors corresponding to an odd bit positioned inputted bit, said NMOS transistor receives at its gate a complement of a first selection control signal and said PMOS transistor receives at its gate said first selection control signal, and wherein for each pair of pass transistors corresponding to an even positioned inputted bit, said NMOS transistor receives at its gate a second selection control signal and said PMOS transistor receives at its gate a complement of said second selection control signal.

* * * * *